PIEZOELECTRIC ENERGY CONVERTER FOR ELECTRONIC IMPLANTS

Filed Oct. 5, 1967

INVENTOR

WEN H. KO

BY Sheridan Neimark

ATTORNEY

United States Patent Office 3,456,134

Patented July 15, 1969

3,456,134

PIEZOELECTRIC ENERGY CONVERTER FOR ELECTRONIC IMPLANTS

Wen H. Ko, Palo Alto, Calif., assignor to the United States of America as represented by the Secretary of Health, Education, and Welfare Filed Oct. 5, 1967, Ser. No. 673,115

Int. Cl. H01v 7/02

U.S. Cl. 310—8.5 3 Claims

ABSTRACT OF THE DISCLOSURE

A piezoelectric converter for electronic implants for converting body motion into electrical energy for driving the implants by having a completely encased piezoelectric crystal in the form of a cantilever beam whose free end is loaded with a weight to resonate at a suitable frequency corresponding to the movement of the enclosing casing. As the base of the case is moved periodically, the crystal wafer is caused to vibrate at its natural frequency with varying amplitude, causing an electrical output, which is then rectified through a voltage doubler to drive the implant or pacemaker.

The present invention relates to a piezoelectric converter for converting motion to electrical energy and has particular reference to an improved converter assembly to convert body motions into electrical energy for the driving of electronic implants such as a pacemaker machine.

Previous applications of piezoelectric converters for implanted cardiac pacemakers have made use of direct mechanical coupling between the moving source and the crystal wafer. Therefore, the crystal had to be encapsulated with a material which was flexible and yet impervious to body fluid. This type of construction was necessary in order to transmit the motion while protecting the piezoelectric crystal wafer from corrosion and short circuit effects of body fluid. Suitable potting materials for long term implants of this type are yet to be provided.

The present invention relates to a new mode of operation for a piezoelectric energy converter to convert body motions into electrical energy, with no direct physical contact between the piezoelectric crystal and the source of motion being required. The mechanical motion is transmitted to the crystal through a base mounting and a loading weight. The crystal operates in its resonant mode rather than the conventional deflection mode, thereby increasing the conversion efficiency.

These, as well as further advantages which are inherent in the invention, will become apparent from the following description, reference being made to the accompanying drawings, wherein.

Figure 1:
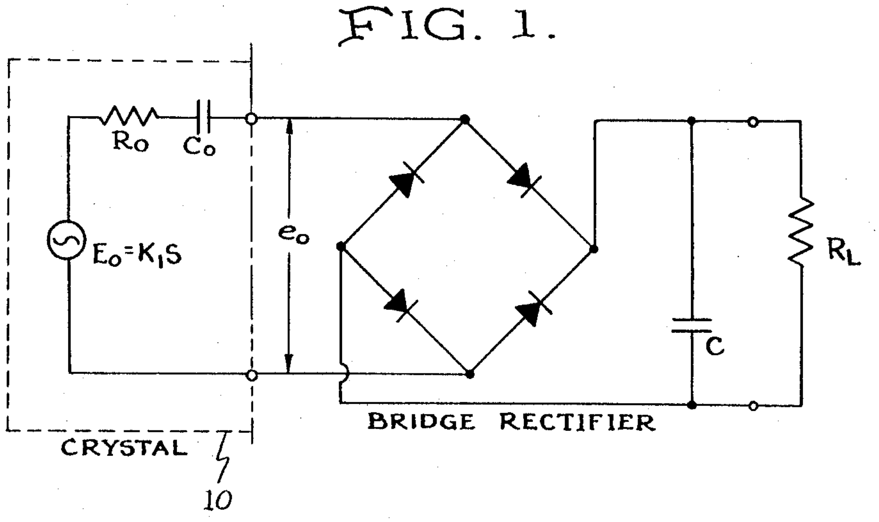
FIG. 1 shows an equivalent circuit of the piezoelectric wafer obtained from its physical properties and the conventional bridge rectifier circuit.

Referring first to FIG. 1, there is shown an equivalent circuit of the piezoelectric wafer or crystal 10 due to its physical properties. The mechanical movement produces an output voltage $e_0$. Potentially, the conversion efficiency from mechanical deflection to electrical energy can be high for high frequency vibrations and a properly selected load $R_L$. However, at the low frequencies of body motion which are encountered with the electronic implants, the small series capacity $C_0$ limits the conversion efficiency and hence, the output power $e_0$ to a very small value.

Figure 2:
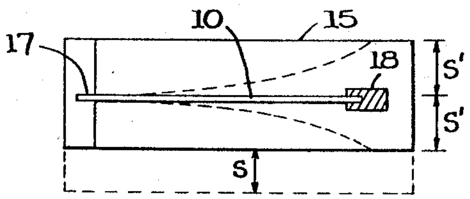
FIG. 2 is a diagrammatic representation of the structure of the present invention.
Figure 4:
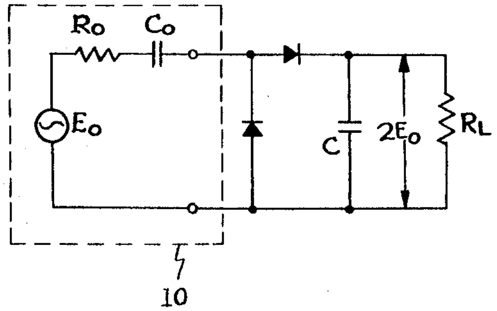
FIG. 4 is a circuit of a piezoelectric crystal converter of the present invention.
Figure 3:
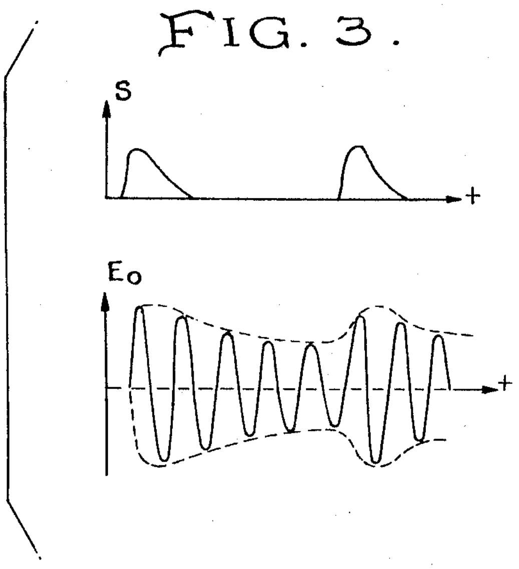
FIG. 3 shows electrical wave forms generated by the structure of the present invention.

An attempt to overcome these difficulties is made both by the construction shown in FIG. 2 and the circuit modification of FIG. 4. Referring to FIG. 2, the structure of the implant comprises a container 15 made of metal, glass, or plastic but of such metal, glass, or plastic which would not be affected by the surrounding body elements in which the implant takes place. Inside this sealed container 15 there is found a crystal 10, in the form of a cantilever beam, anchored at 17 to and supported by the container 15. Attached to the free end of the crystal cantilever beam 10 is a weight 18. The relative size of container 15, cantilever beam crystal 10, weight 18, and the placement of the cantilever beam 10 in container 15 should be such that the cantilever beam 10 is free to swing its fullest extent S′ without contacting the inner sides of container 15. This amplitude of swing S′ is determined by the length and material of cantilever beam 10, the size of weight 18, and in addition, by the amount of movement due to body motion through which container 15 is moved. The body motion which moves container 15 with the end loaded cantilever beam 10 causes the cantilever beam 10 to resonate at a suitable frequency corresponding to the mechanical driving source or body. As the container base is moved periodically, the crystal cantilever beam 10 is caused to vibrate at its natural frequency with varying amplitude. It, thus, generates trains of electrical voltage as shown in FIG. 3. In this figure, the amplitude S is shown in registration for comparison with the voltage $E_0$ generated by the cantilever beam crystal 10.

In order to utilize the crystal in the structure described and to fully utilize the capacitance of the crystal, a voltage doubler circuit, as illustrated in FIG. 4, was developed for combination with the crystal. This circuit uses diodes for rectification, an external capacitor C and the crystal capacitor $C_0$ for voltage doubler; the crystal 10 may be of a type known as a Clevite PZT–5H crystal. With such an energy converter, when the device is driven at a mechanical pulse rate of 80 pulses per minute and with a motion similar to the heart motion of a dog, upon which it was tested, the maximum output is 4.0 volts at 105 ohms load, or 160 microwatts. This power is sufficient to drive a pacemaker and some of the existing implant telemetry systems.

In tests, the performance of this new operation mode has been shown to be more desirable than the conventional mode.

In addition, this design has eliminated the package problem wherein the implant is placed in the body, while increasing the output of the converter over the original output of prior art converters.

It will be obvious to those skilled in the art that various changes may be made without departing from the scope of the invention and the invention is not to be considered limited to what is shown in the drawings and described in the specification.

What is claimed is:

1. A converter of body motion to electrical energy for use with electronic implants in the body comprising:

a closed container of a material not affected by body fluids, a piezoelectric crystal in the form of a cantilevered beam within said container and extending inwardly from a wall of said container with one end anchored in said container wall and the opposite end free to move, a weight mounted on said free end of said crystal cantilevered beam, and means connecting said crystal to the electronic implants in the body.

2. The converter of claim 1, further characterized by: said means to connect said crystal output to the electronic implants in the body including a voltage doubler circuit utilizing the crystal capacitance for useful function.

3. The converter of claim 2, further characterized by: said cantilevered beam and said weight having a combined loading for resonating at a low frequency comparable to the frequency of body motion.

References Cited

UNITED STATES PATENTS

| | | | |
|---|---|---|---|
| 3,113,233 | 12/1963 | Smith et al. | 310—8.5 |
| 2,478,223 | 8/1949 | Argabrite | 310—8.4 |

OTHER REFERENCES

A Cardiac Pacemaker Using Biologic Energy Sources, V. Parsonnet, G. Myers, I. R. Zucker, H. Lotman and M, Asa, vol. IX, Amer. Soc. Artif. Int. Organs, 1963, pp. 174–177.

Biologically Energized Cardiac Pacemakers, G. Myers, V. Parsonnet, I. R. Zucker and H. A. Lotman, Amer. Journal of Medical Electronics, October–December 1964, pp. 233–236.

MILTON O. HIRSHFIELD, Primary Examiner

M. O. BUDD, Assistant Examiner

U.S. Cl. X.R.

128—419; 179—107; 310—8.1, 8.9; 331—116